United States Patent
Yoshida

[11] 4,031,481
[45] June 21, 1977

[54] TRANSISTOR AMPLIFIER

[75] Inventor: Tadao Yoshida, Tokyo, Japan

[73] Assignee: Sony Corporation, Tokyo, Japan

[22] Filed: May 16, 1975

[21] Appl. No.: 578,195

[30] Foreign Application Priority Data

May 23, 1974 Japan ............... 49-59292[U]

[52] U.S. Cl. .................. 330/35; 330/13; 330/17; 330/18

[51] Int. Cl.² .......................... H03F 3/16

[58] Field of Search ............ 330/13, 15, 17, 18, 330/35

[56] References Cited

UNITED STATES PATENTS 3,418,589  12/1968  Yee ............................. 330/13
3,862,367  1/1975   Kono et al. ............... 330/13 X

*Primary Examiner*—Rudolph V. Rolinec
*Assistant Examiner*—Lawrence J. Dahl
*Attorney, Agent, or Firm*—Lewis H. Eslinger; Alvin Sinderbrand

[57] ABSTRACT

A transistor amplifier comprised of a class-A amplifier connected in cascade with a push-pull amplifier. The class-A amplifier includes first and second field effect transistors having triode-type dynamic characteristics with their respective gate electrodes connected to receive an input signal and their source and drain electrodes connected in series across opposite power supply terminals. The push-pull amplifier includes third and fourth field effect transistors having triode-type dynamic characteristics with their respective gate electrodes connected to the first and second field effect transistors and their source and drain electrodes connected in series across the opposite power supply terminals.

6 Claims, 4 Drawing Figures

TRANSISTOR AMPLIFIER

BACKGROUND OF THE INVENTION

This invention relates to a transistor amplifier and, more particularly, to a transistor amplifier comprised of cascaded stages each formed of a plurality of field effect transistors having triode-type dynamic characteristics.

The use of a field effect transistor (FET) having triode-type dynamic characteristics offers many advantages which cannot be obtained from conventional FET's which have pentode-type dynamic characteristics. For example, harmonic distortion is reduced and switching characteristics are improved for the FET having triode-type dynamic characteristics. Also, this type of FET has a greatly improved linearity function. Consequently, the FET having triode-type dynamic characteristics finds ready application in high fidelity audio equipment, especially as the output stage of a power amplifier.

Because of the advantages obtained from such an FET, it is desirable to use this device in various stages of an audio amplifier to provide non-distorted amplification of small signals. However, FET's having triode-type dynamic characteristics admit of considerably smaller amplification factors than conventional field effect transistors. Thus, in order to attain the requisite large voltage gain for a practical small signal amplifier, it is necessary to connect a plurality of this type of FET in cascade. Unfortunately, although the desired voltage gain can be attained, the cascading of many FET stages results in a deteriorated signal-to-noise ratio. It is, therefore, desired to construct a small-signal amplifier which is capable of producing efficient voltage gain, but not at the cost of poor signal-to-noise.

OBJECTS OF THE INVENTION

Therefore, it is an object of this invention to provide a transistor amplifier comprised of a plurality of cascade connected field effect transistors having triode-type dynamic characteristics with good signal-to-noise ratio.

Another object of the present invention is to provide a transistor amplifier comprised of at least four field effect transistors having triode-type dynamic characteristics.

A still further object of the present invention is to provide a transistor amplifier comprised of a class-A amplifier stage driving a pair of complementary field effect transistors connected in a drain follower configuration as an output stage.

Yet another object of this invention is to provide a transistor amplifier having a satisfactory voltage gain and signal-to-noise ratio, formed of a class-A amplifier stage connected to cascade with a push-pull amplifier stage, each amplifier stage being comprised of field effect transistors having triode-type dynamic characteristics.

Various other objects and advantages of the present invention will become apparent from the ensuing detailed description, and the novel feature will be particularly pointed out in the appended claims.

SUMMARY OF THE INVENTION

In accordance with the present invention, an improved transistor amplifier is provided including a class-A amplifier connected in cascade with a push-pull amplifier, the class-A amplifier comprising first and second field effect transistors each having triode-type dynamic characteristics with their gate electrodes connected to receive an input signal and their source and drain electrodes connected in series between a pair of power supply terminals; and the push-pull amplifier comprising third and fourth field effect transistors each having triode-type dynamic characteristics with their gate electrodes connected to respective ones of the first and second field effect transistors and their source and drain electrodes connected in series between the pair of power supply terminals.

BRIEF DESCRIPTION OF THE DRAWINGS

The following detailed description will best be understood in conjunction with the accompanying drawings in which.

DETAILED DESCRIPTION OF CERTAIN ONES OF THE PREFERRED EMBODIMENTS

Figure 1:
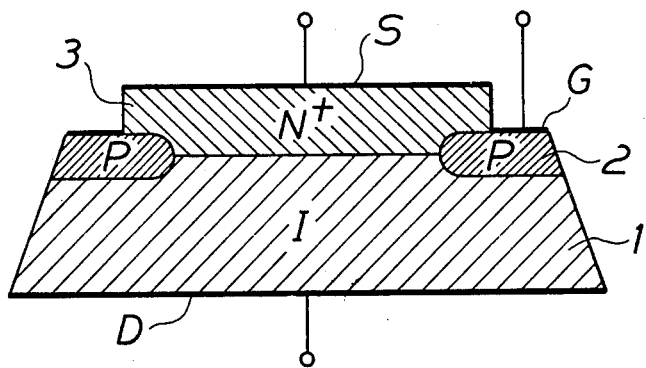
FIG. 1 is a sectional view of one embodiment of a field effect transistor having triode-type characteristics which may be used with the present invention.

Referring to the drawings, and in particular to FIG. 1, there is depicted a sectional view of one example of an FET having triode-type dynamic characteristics which may be used in the transistor amplifier in accordance with this invention. The FET is a vertical junction structure formed of an intrinsic semiconductor region 1 having low impurity concentration and high resistance, a P-type semiconductor region 2 having an annular configuration and formed on the upper portion of the intrinsic region 6, and an N-type semiconductor region 3 having high impurity concentration formed over both the annular P-type region 2 and the intrinsic region 1, as shown. The P-type region 2 may be formed by conventional selective diffusion techniques and the N-type region 3 may be formed by conventional epitaxial techniques. Of course, other methods can be used to form these regions, as desired. Respective drain D, gate G and source S electrodes are provided at the lower surface of the intrinsic region 1, an exposed portion of the P-type annular region 2 and the upper surface of the N-type region 3, respectively.

Figure 2:
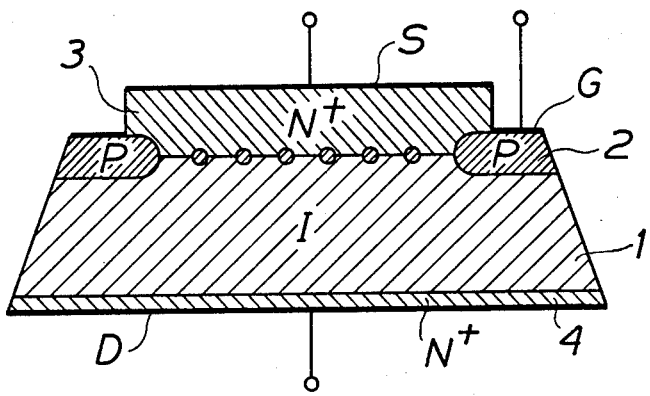
FIG. 2 is a sectional view of another embodiment of a field effect transistor which may be used with the present invention.

The vertical junction FET depicted in FIG. 1 exhibits triode-type dynamic characteristics. A preferred embodiment of such an FET is depicted in FIG. 2 wherein like reference numerals identify corresponding elements. The FIG. 2 embodiment may be thought of as being formed by a combination of plural FET's of the type shown in FIG. 1 and closely resembles the aforedescribed FIG. 1 embodiment of the FET with the added modifications that the P-type annular region 2 is formed with a mesh-type structure therewithin, as shown. Accordingly, the high impurity concentration N-type region 3 is seen to overlie both the annular and mesh-shape P-type region 2 and the intrinsic region 1, the mesh-shape defining a boundary between the intrinsic region and the overlying high impurity concentration N-type region. Furthermore, an additional N-type semiconductor region 4 having high impurity concentration is formed on the lower surface of the intrinsic semiconductor region 1, and the drain electrode D is formed thereon. The additional N-type region serves to increase the breakdown voltage between the drain and source electrodes.

In the FET of FIGS. 1 and 2, an increase in the negative gate voltage causes the growth of depletion layers that extend from portions of the gate region 2 between regions 1 and 3 to form a channel in the region 3 between such gate portions. Since the region 3 is shown to be of N-type conductivity, the illustrated FET's are of the N-channel type. Of course, it is apparent that similar FET's may be provided with the regions 2 and 3 thereof being of N-type and P-type conductivities, respectively, so as to be of the P-channel type.

Regardless of the conductivity-type of construction of the FET, the equivalent internal resistance between the source and drain electrodes is a composite resistance comprised of the resistance between the source electrode and the channel within the FET, the resistance of the channel itself and the resistance between the channel and the drain electrode. In the prior art junction FET the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIGS. 1 and 2 is characterized by a relatively small separation between the source electrode S and the vertical channel and, additionally, the channel length itself is relatively small so that the ratio of channel width to length is larger than that of the prior art lateral channel FET. Consequently, the output resistance of the vertical junction FET depicted in FIGS. 1 and 2 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

Figure 3:
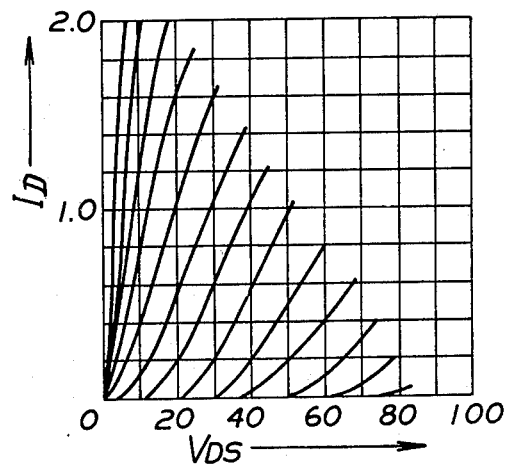
FIG. 3 is a graphical representation illustrating typical dynamic characteristics of a field effect transistor having triode-type characteristics.

An illustration of the dynamic characteristics exhibited by the FET shown in FIGS. 1 and 2 is graphically represented in FIG. 3. This graphical representation depicts the relationship between thd drain current $I_D$ and the drain voltage $V_D$. Each individual curve represents the current-voltage relationship for corresponding gate voltages $V_g$ wherein the gate voltage is the variable parameter. It is recognized that the characteristic curves shown in FIG. 3 are analogous to the curves which represent the dynamic characteristics of a conventional triode. Therefore, because the FET is of the type which exhibits triode-type dynamic characteristics, the output resistance is substantially constant and the FET is capable of producing a large output signal having little distortion.

Among the advantages attained by the use of the illustrated FET having triode-type dynamic characteristics is that the larger ratio of vertical channel width to channel length between the drain and source regions permits a higher drain current to flow. Another advantage is that the characteristic curves depicting the relationship between drain current and gate voltage are linear so that odd harmonic distortion is reduced. Yet another advantage is the reduction in switching distortion which is attributed to the fact that the FET does not have the storage carriers which are included in bipolar transistors. Still another advantage is the high input impedance of the FET. As a result of such input impedance, the load presented by an input source does not cause nonlinear distortion. Yet a further advantage lies in the fact that, because of its low output resistance, the illustrated FET can readily drive a load which requires a relatively high damping factor. An additional advantage is that if the illustrated FET is used in a push-pull amplifier, a complementary push-pull circuit can be formed of simple circuit construction.

The conventional lateral junction FET cannot achieve the foregoing advantages, primarily because it exhibits pentode-type dynamic characteristics and thus has a very high output resistance, on the order, for example, of several megohms. Thus, with the conventional FET, as the drain voltage increases, the drain current is driven into saturation at a relatively low value of drain voltage.

Figure 4:
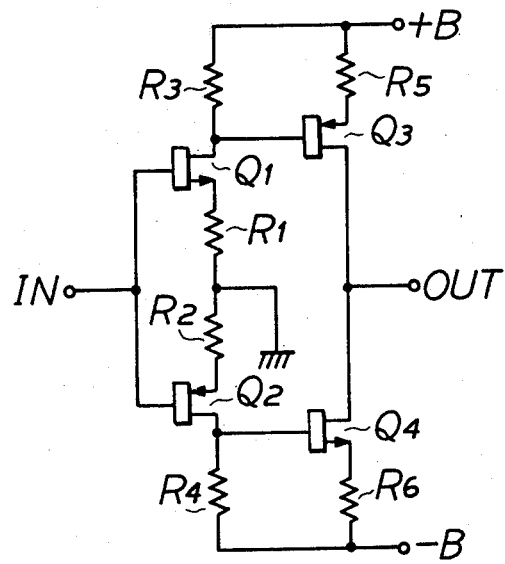
FIG. 4 is a schematic diagram of one embodiment of a transistor amplifier in accordance with the teachings of this invention.

Referring now to FIG. 4, one embodiment of a transistor amplifier in accordance with the teachings of the present invention is schematically illustrated. A first stage including FET's $Q_1$ and $Q_2$ is connected in cascade with a second stage including FET's $Q_3$ and $Q_4$. The FET's of the first stage are of opposite conductivity type, the FET $Q_1$ being illustrated as a N-channel FET having triode-type dynamic characteristics and the FET $Q_2$ being illustrated as a P-channel FET, also having triode-type dynamic characteristics. A power supply B having, for example, a positive terminal for supplying a positive operating voltage +B and a negative terminal for supplying a negative operating voltage −B is connected across the FET's $Q_1$ and $Q_2$. More particularly, a series circuit is provided across the opposite power supply terminals comprising, in order, a resistor $R_3$, the drain electrode of the FET $Q_1$, the source electrode of the FET $Q_1$, a resistor $R_1$, a resistor $R_2$, the source electrode of the FET $Q_2$, the drain electrode of the FET $Q_2$ and a resistor $R_4$. The resistors $R_1$ and $R_2$ act as self-biasing resistors and the junction defined thereby is connected to a reference potential, such as ground. A capacitor (not shown) may be provided in parallel with the resistors $R_1$ and $R_2$ to by-pass AC signals. As shown, the gate electrodes of the FET's $Q_1$ and $Q_2$ are connected in common to an input terminal to receive an input signal to be amplified. It may be appreciated that the first stage is adapted to operate as a class-A amplifier.

The FET's $Q_1$ and $Q_2$ may be considered to be disposed in common source configuration. Accordingly, the amplifier output is derived from the drain electrodes of these FET's and is supplied to the second stage of the amplifier. The second stage is adapted to operate as a complementary push-pull amplifier, and the FET's $Q_3$ and $Q_4$ are of opposite conductivities. More particularly, if the FET $Q_1$ is an N-channel type, the FET $Q_3$ is a P-channel type having its gate electrode connected to the drain electrode of the FET $Q_1$. Similarly, if the FET $Q_2$ is a P-channel type, the FET $Q_4$ is an N-channel type having its gate electrode connected to the drain electrode of the FET $Q_2$. Furthermore, the respective source electrodes of the push-pull FET's are connected through resistors $R_5$ and $R_6$ to the opposite power supply terminals. The drain electrodes of the FET's $Q_3$ and $Q_4$ are connected to each other to complete a series circuit across the power supply terminals and, additionally, to an output terminal which is adapted to be coupled to a load. It may be appreciated that such a load may be driven by the complementary push-pull stage in class-B or -AB operation.

If the circuit of FIG. 4 is considered first with respect to the DC biasing in the absence of an input signal, then it will be seen that the DC bias voltage between the gate and source electrodes of the FET $Q_1$ is equal to the voltage drop across the resistor $R_1$ due to the drain bias current flowing through the FET $Q_1$. A similar DC bias voltage is provided across the gate and source electrodes of the FET $Q_2$. The bias voltage across the gate and source electrodes of the FET $Q_3$ is equal to the difference between the voltage drop across the resistor $R_5$ (due to the drain bias current flowing through the FET $Q_3$) and the voltage drop across the resistor $R_3$. A similar bias voltage is provided across the gate and source electrodes of the FET $Q_4$.

In view of the foregoing, it is appreciated that fluctuations in the drain bias current of the FET $Q_1$ directly affects the gate-source bias voltage of the FET $Q_3$, resulting in a variation of the operating point of the latter FET. The drain bias current flowing through the FET $Q_1$ can be stabilized in accordance with various types of stabilizing arrangements, such as the types disclosed in copending U.S. application Ser. No. 508,836, filed on Sept. 24, 1974, or U.S. application Ser. No. 577,678, filed May 15, 1975, now U.S. Pat. No. 3,974,555 issued Aug. 10, 1976 or U.S. application Ser. No. 578,194, filed May 16, 1975, now U.S. Pat. No. 3,968,451 issued July 16, 1976, as examples. Once the FET drain bias current is stabilized, the bias voltages across the respective FET's $Q_1$-$Q_4$ can be suitably set and/or adjusted.

Let it be assumed that the amplification constant of the FET $Q_1$ is equal to the amplification constant of the FET $Q_2$ and is represented as $\mu_1$. Let it further be assumed that these FET's have equal internal resistance $rd_1$, and the resistors $R_1$-$R_4$ all have the same resistance value. Now, if an input signal is applied to the amplifier, the gain $G_1$ of the FET $Q_1$ (or $Q_2$) can be expressed as:

$$G_1 = \frac{\mu_1 R_3}{(1+\mu_1)R_1 + rd_1 + R_3} \quad (1)$$

The factor $(1+\mu_1)$ is attributed to the self-biasing resistor $R_1$ and, when an AC signal is amplified, can be neglected if a by-pass capacitor (not shown) as previously described is used. Accordingly, if the input signal is assumed to be an AC signal, equation (1) can be simplified to:

$$G_1 = \frac{\mu_1 R_3}{rd_1 + R_3} \quad (2)$$

Considering the push-pull stage, let it be assumed that the amplification constant of the FET $Q_3$ is equal to the amplification constant of the FET $Q_4$ and is represented as $\mu_3$.

Let it be further assumed that these FET's have equal internal resistance $rd_3$, and the resistors $R_5$ and $R_6$ have the same resistance value. The gain $G_2$ of the push-pull stage can be expressed as:

$$G_2 = \frac{\mu_3 \cdot Z'_0 \times 2}{(1+\mu_3)R_5 + rd_3 + Z'_0} \quad (3)$$

where $Z'_0$ is the impedance as seen from the drain electrode of one of the FET's $Q_3$ or $Q_4$. This impedance $Z'_0$ is equal to:

$$Z'_0 = (1+\mu_3)R_5 + rd_3 \quad (4)$$

By substituting equation (4) into equation (3), the gain $G_2$ can be simplified to:

$$G_2 = \mu_3 \quad (5)$$

Hence, the total voltage gain G of the illustrated amplifier is:

$$G = G_1 \cdot G_2 = \mu_1 \cdot \mu_3 \cdot R_3/(rd_1+R_3) \quad (6)$$

Since the FET's $Q_1$ and $Q_2$ have triode-type dynamic characteristics, $rd_1 \ll R_3$. Consequently, equation (6) can be simplified to:

$$G \approx \mu_1 \cdot \mu_3 \quad (7)$$

where the symbol $\approx$ means substantially equal to. It is thus seen that the capability of each of the FET's is maximized.

Furthermore, the distortion factor of the push-pull stage comprised of the FET's $Q_3$ and $Q_4$ is greatly improved because of the source resistors $R_5$ and $R_6$.

Although exhibiting a relatively simple construction, the amplifier of this invention obtains maximum performance from the FET's to derive high amplification with minimal signal distortion. DC amplification can be readily achieved, and the DC coupling between stages results in excellent phase characteristics while avoiding instabilities that otherwise would be caused by switching distortion and ambient temperature affects. If the amplifier is to be used for amplification of an AC signal, a by-pass capacitor may be connected in parallel with each source resistor $R_5$ and $R_6$ to thereby reduce the output impedance of the amplifier.

While the present invention has been shown and described with reference to preferred embodiments thereof, it will be obvious to those skilled in the art that various changes and modifications in form and details may be made without departing from the spirit and scope of the invention. It is therefore intended that the appended claims be interpreted as including all such changes and modifications.

What is claimed is:

1. A transistor amplifier comprising:
   power supply means having a pair of terminals for providing operating potentials;
   first and second field effect transistors each having triode-type dynamic characteristics, the gate electrodes of said first and second field effect transistors being supplied with an input signal to be amplified and the source and drain electrodes of said first and second field effect transistors being connected in a series circuit between said pair of terminals, the source electrodes of said field effect transistors being connected to each other, and said first and second field effect transistors operating as a common source class-A amplifier;

a first connection point connected to one of said source and drain electrodes of said first transistor;

a second connection point connected to one of said source and drain electrodes of said second transistor and having a different DC voltage level than said first connection point; and third and fourth field effect transistors each having triode-type dynamic characteristics, the gate electrode of said third field effect transistor being directly connected to the drain of said first field effect transistor, and the gate electrode of said fourth field effect transistor being directly connected to the drain of said second field effect transistor, said third and fourth field effect transistors being connected in push-pull amplifier configuration, and the drains of said third and fourth field effect transistors being connected to an output terminal and having their source electrodes connected to said pair of terminals.

2. A transistor amplifier comprising:

power supply means having a pair of terminals for providing operating potentials;

first and second field effect transistors each having triode-type dynamic characteristics, the gate electrodes of said first and second field effect transistors being supplied with an input signal to be amplified and the source and drain electrodes of said first and second field effect transistors being connected in a series circuit between said pair of terminals;

first and second impedances connected in series with each other and comprising part of said series circuit and being connected in said series circuit between the source electrodes of said first and second field effect transistors, each of said impedances also being connected in series between a reference potential and the source electrode of a respective one of said first and second transistors so that said first and second field effect transistors operate as a common source class A amplifier;

third and fourth impedances connected in series between the drain electrodes of said first and second transistors, respectively, and respective ones of said pair of terminals, said third and fourth impedances comprising part of said series circuit;

a first connection point connected to one of said source and drain electrodes of said first transistor;

a second connection point connected to one of said source and drain electrodes of said second transistor and having a different DC voltage level than said first connection point;

third and fourth field effect transistors each having triode-type dynamic characteristics, the gate electrode of said third field effect transistor being directly connected to the drain of said first field effect transistor, and the gate electrode of said fourth field effect transistor being directly connected to the drain of said second field effect transistor, said third and fourth field effect transistors being connected in push-pull amplifier configuration, and the drains of said third and fourth field effect transistors being connected to an output terminal; and fifth and sixth impedances connected between said pair of terminals, respectively, and the source electrodes of said third and fourth field effect transistors.

3. A transistor amplifier in accordance with claim 2 wherein said first and second field effect transistors are of opposite conductivity type, said first and third field effect transistors are of opposite conductivity type, and said second and fourth field effect transistors are of opposite conductivity type.

4. A transistor amplifier in accordance with claim 2 wherein each of said impedances comprises a resistor.

5. A transistor amplifier in accordance with claim 4 wherein the application constants of said first and second field effect transistors are substantially equal to each other and to $\mu_1$; and wherein the amplification constants of said third and fourth field effect transistors are substantially equal to each other and to $\mu_2$.

6. A transistor amplifier in accordance with claim 5 wherein said first, second, third, and fourth impedances are substantially equal to each other and the total gain from the gate electrodes of said class-A amplifier to said output terminal is substantially equal to the product $\mu_1 \cdot \mu_2$.

* * * * *